US007026834B2

(12) United States Patent
Hwang

(10) Patent No.: US 7,026,834 B2
(45) Date of Patent: Apr. 11, 2006

(54) MULTIPLE TWO AXIS FLOATING PROBE BLOCK ASSEMBLY USING SPLIT PROBE BLOCK

(75) Inventor: David Hwang, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/222,286

(22) Filed: Sep. 8, 2005

(65) Prior Publication Data

US 2006/0006897 A1 Jan. 12, 2006

Related U.S. Application Data

(62) Division of application No. 10/602,132, filed on Jun. 24, 2003, now Pat. No. 6,956,388.

(51) Int. Cl.
*G01R 31/26* (2006.01)

(52) U.S. Cl. ....................................... 324/758; 324/754

(58) Field of Classification Search ..................... None
See application file for complete search history.

*Primary Examiner*—Paresh Patel

(57) ABSTRACT

A novel probe block assembly which independently floats multiple probe blocks in a single frame is presented. The independently floating probe blocks allow multiple probes to align independently with respective multiple mating features on a device under test. The use of a single frame allows multiple insertion probe testing via one actuation motion.

4 Claims, 3 Drawing Sheets

MULTIPLE TWO AXIS FLOATING PROBE BLOCK ASSEMBLY USING SPLIT PROBE BLOCK

CROSS REFERENCE TO RELATED APPLICATIONS

This is a divisional of application Ser. No. 10/602,132 filed on Jun. 24, 2003, U.S. Pat. No. 6,956,388 the entire disclosure of which is incorporated herein by reference.

BACKGROUND OF THE INVENTION

The present invention relates generally to electrical device testing, and more particularly to a multiple two-axis floating split probe block assembly for testing an electrical device.

Electrical testing of electrical devices often involves insertion probing of a receptacle of the device. For example, a cellular phone often includes a receptacle configured as an array of signal points on the device under test (hereinafter referred to as the "system connector"). The device, in this example a cellular phone, may also include additional receptacles such as an audio receptacle into which a headset audio plug is inserted or a charger receptacle into which an A/C charger plug is inserted to charge up the device.

During or after manufacturing, various tests are performed on the device (hereinafter referred to as "device under test" or "DUT"). Typically at least one or more tests require insertion probing of two or more of the DUT receptacles. Insertion probing involves the insertion of a probe into the mating DUT receptacles such that the probes and DUT receptacles make electrical contact. The electrical contact is the means through which the probe stimulates and/or receives measurement signals from the DUT. Although insertion probing is itself a conceptually straightforward idea, the design of the probe that is used for this purpose does require several important considerations. First, due to manufacturing limitations, at least some error relative to specification typically exists in the precision of the location of the electrical pads of the device which the probe must electrically contact. Thus, over hundreds and thousands of a given device to be tested, the probe must be designed to take into account the pad location tolerances such that it can reliably make electrical contact with each DUT to be probed.

In order to account for the pad location tolerances of a given DUT design, a "floating" probe block is sometimes used. In a floating probe block, the probe is attached to a block which is encased in a substantially conforming frame that holds the block in place while allowing the block a small amount of "wiggle room" within the frame. This solution allows the receptacle to assist in aligning the probe within the receptacle. However, the use of a single floating probe block is problematic when probing two or more receptacles on the DUT (e.g., charger plugs and audio plugs).

Due to manufacturing limitations, at least some error relative to specification typically exists in the precision of the location of the DUT receptacles relative to the DUT case and also relative to the other DUT receptacles on the DUT. Thus, over hundreds and thousands of a give DUT to be tested, the probe block must be designed to take into account the receptacle location tolerances such that the probes of the probe block can reliably make electrical contact with each DUT receptacle to be probed.

A single probe block cannot account for these differences. The single probe block aligns to one of the receptacle features on the DUT, while forcing the other probes into their respective receptacles. This force is a major source of wear on both the DUT being probed and the probe block, and also can cause connector failure on the DUT.

SUMMARY OF THE INVENTION

The present invention is a multiple two-axis floating split probe block assembly for testing an electrical device. The invention uniquely provides a floating probe block assembly with independent floating probe blocks for each probe to be inserted into the DUT. Each independent floating probe block is mounted in a single common probe block assembly frame. Each independent floating probe block therefore floats independently of the other probe blocks in the frame to allow it to directly align with its mating receptacle on the DUT. The unique multiple-independent float capability of the invention allows reduction in wear on the probe block and DUT receptacle, and also reduces the insertion force required to probe the DUT. This allows for smaller insertion probing actuators, thereby saving space and cost while minimizing wear to the DUT. In addition, insertion probing of multiple receptacles may be performed with one actuating action, thereby reducing test time.

The present invention is ideal for use in a test fixture during manufacturing- or final-level device under test (DUT) in which the DUT requires some insertion probing of multiple receptacles whose location on the DUT varies with respect to each other. The invention compensates for DUT-to-DUT and fixture-to-fixture differences over thousands of DUTs, in a novel manner that is more reliable than other methods currently used.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
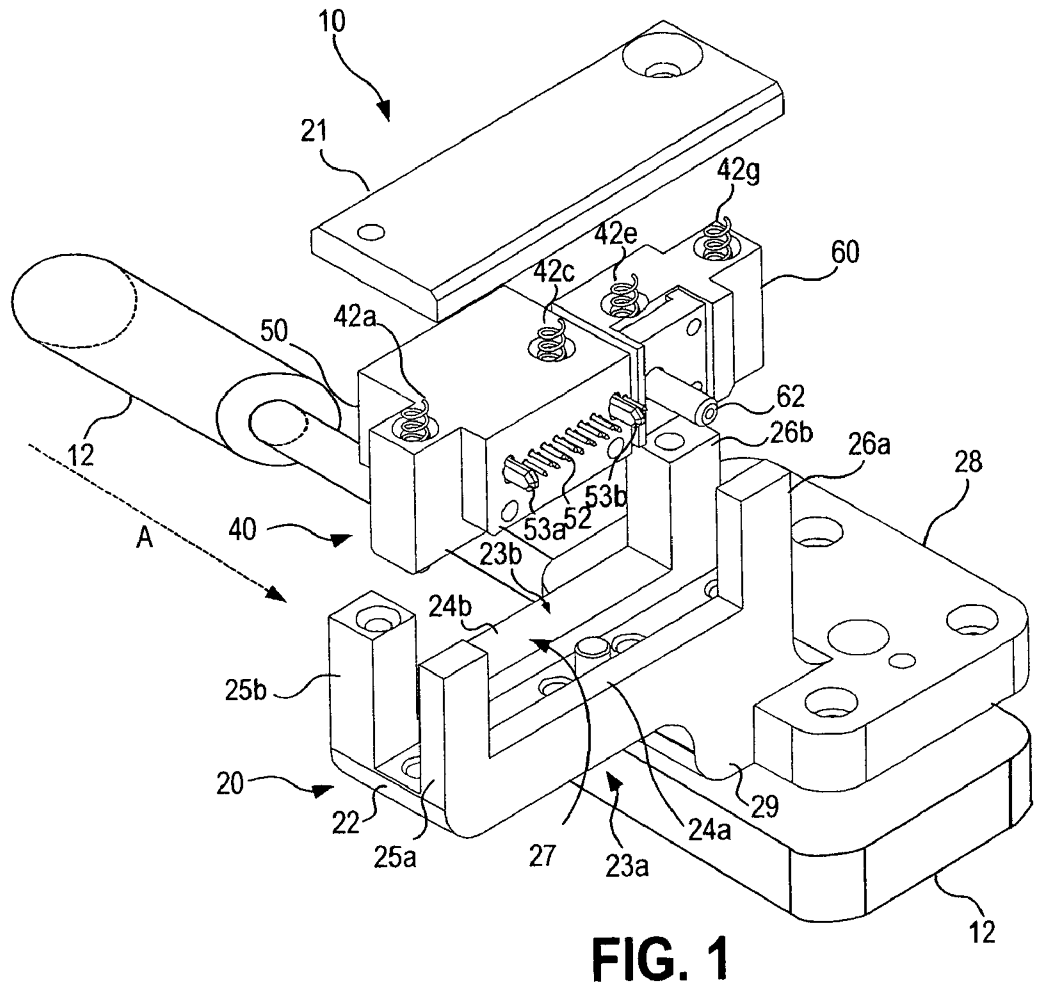
FIG. 1 is an exploded isometric view of a floating probe block assembly implemented in accordance with the invention.

Turning now to the drawings, FIGS. 1–5 illustrate a preferred embodiment of a multiple two-axis floating split probe block assembly 10 for testing an electrical device. In this embodiment, the probe block assembly 10 includes a split probe block 40 (i.e., two independent probe blocks 50, 60) mounted in a single common probe block frame 20.

In the illustrative embodiment, the probe block assembly 10 is designed to probe the system connector and audio jack of a cellular phone (not shown). Accordingly, in the illustrative embodiment, the probe block assembly 10 comprises two independent probe blocks, including a system connector probe block 50 for probing a system connector and an audio jack probe block 60 for probing an audio jack on the cellular phone.

In the illustrative embodiment, the system connector of the cellular phone (not shown) comprises an array of electrical contact pads and a two-prong electrical socket. Accordingly, the system connector probe block 50 of the probe block assembly 10 includes a mating array of spring-loaded probes 52 for contacting the electrical contact pads of the cellular phone and an electrical two-prong plug 53*a*, 53*b* for insertion into the cellular phone electrical two-prong socket when the system connector probe block 50 is used to probe the cellular phone system connector.

Also in the illustrative embodiment, the audio jack of the cellular phone comprises a single audio jack (not shown). Accordingly, the audio jack probe block 60 of the probe block assembly 10 includes a mating audio plug 62 for insertion in the cellular phone audio jack.

Figure 3:
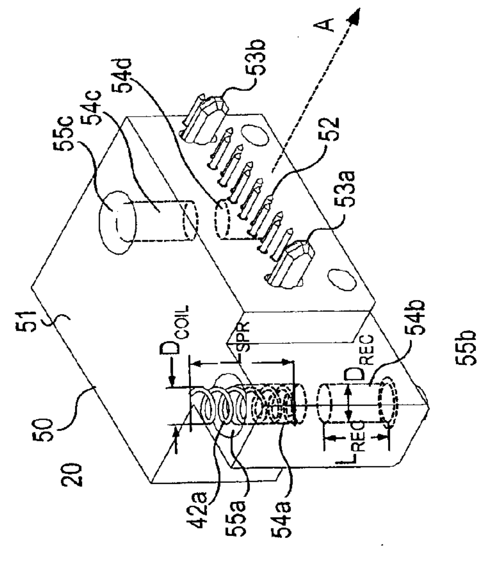
FIG. 3 is a detailed isometric view of one of the probe blocks from the floating probe block assembly of FIG. 1.

FIG. 3 shows the system connector probe block 50 (which probes the system connector of a DUT) in greater detail. As illustrated in FIG. 3, the system connector probe block 50 comprises a probe block body 51, an array of system connector probes 52, a power plug comprising a pair of prongs 53*a*, 53*b*, and four self-centering spring receptacles 54*a*, 54*b*, 54*c*, 54*d* (two on top and two on bottom). In the preferred embodiment, the system connector probe block body 51 is configured as a solid block, formed for example from material such as aluminum or steel. The probes 52, 53*a*, 53*b* are electrically connected to wires or traces which are connectable to test and/or measurement circuitry (not shown).

The audio jack probe block 60 is constructed similarly, and is therefore not shown in greater detail (wherein the system connector probes 52 and power plug 53*a*, 53*b* and associated circuitry are replaced with an appropriate audio jack probe 62 and related circuitry (not shown)).

Optionally, to assist with self-centering, in the preferred embodiment each independent probe block 50, 60 includes one or more self-centering spring receptacles 54*a*, 54*b*, 54*c*, 54*d*, 54*e*, 54*f*, 54*g*, 54*h*, each for holding a coil spring 42*a*, 42*b*, 42*c*, 42*d*, 42*e*, 42*f*, 42*g*, 42*h* of longitudinal length $L_{SPR}$ and having a coil diameter of $D_{COIL}$. In the illustrative embodiment, each independent probe block 50, 60 includes two pairs (54*a/b*, 54*c/d*, and 54*e/f*, 54*g/h*, respectively) of self-centering spring receptacles. Each receptacle 54*a*, 54*b*, 54*c*, 54*d*, 54*e*, 54*f*, 54*g*, 54*h* in a given pair of receptacles is located coaxially to the other receptacle in the pair and each opens onto opposing sides of its respective probe block 50, 60. In the preferred embodiment, the coaxial axis of each receptacle pair 54*a/b*, 54*c/d*, and 54*e/f*, 54*g/h* is perpendicular to the probing direction (indicated by arrow A in FIG. 2).

Each spring receptacle 54*a*, 54*b*, 54*c*, 54*d*, 54*e*, 54*f*, 54*g*, 54*h* is preferably configured as a cylindrical bore with circular cross-section of constant diameter. Each spring receptacle 54*a*, 54*b*, 54*c*, 54*d*, 54*e*, 54*f*, 54*g*, 54*h* has one opening to a side of the probe block body and a wall opposite the opening positioned within the probe block 50, 60 to support the spring. In addition, the receptacle opening is preferably countersinked 55*a*, 55*b*, 55*c*, 55*d*, 55*e*, 55*f*, 55*g*, 55*h*, for reasons discussed hereinafter. The cross-sectional diameter $D_{REC}$ of the cylindrical spring receptacle 54*a*, 54*b*, 54*c*, 54*d*, 54*e*, 54*f*, 54*g*, 54*h* is a known precise amount greater than the cross-sectional diameter $D_{COIL}$ of the self-centering spring coil 42*a*, 42*b*, 42*c*, 42*d*, 42*e*, 42*f*, 42*g*, 42*h* that is designed to fit into it, and is sufficient to allow a small amount of "wiggle room" without allowing significant shear (side-to-side) deflection. The length $L_{REC}$ of the spring receptacle 54*a*, 54*b*, 54*c*, 54*d*, 54*e*, 54*f*, 54*g*, 54*h* is a known precise amount less than the longitudinal length $L_{SPR}$ of the coil spring 42*a*, 42*b*, 42*c*, 42*d*, 42*e*, 42*f*, 42*g*, 42*h* when the coil spring is in a non-deformed state.

A coil spring 42*a*, 42*b*, 42*c*, 42*d*, 42*e*, 42*f*, 42*g*, 42*h* characterized by a longitudinal length $L_{SPR}$ and cross-sectional diameter of $D_{COIL}$ as just described is mounted in each receptacle 54*a*, 54*b*, 54*c*, 54*d*, 54*e*, 54*f*, 54*g*, 54*h* of the probe blocks 50, 60.

It is to be understood that the self-centering features just described are optional only for purposes of assisting in self-centering the independent probe blocks within the frame 20. However, such self-centering is not a necessary feature of the invention itself.

In the illustrative embodiment, the probe block frame 20 is substantially conforming to the outer shape (less the probes 52, 53*a*, 53*b*, 62 and certain other protruding features) of the composite independent probe blocks 50, 60 when seated side by side in the frame 20, and includes apertures 27 to allow the probes 52, 53*a*, 53*b*, 62 and other protruding features of the probe blocks 50, 60 to protrude outside the frame 20 when the probe blocks 50, 60 are seated within the probe block frame 20. The inner dimensions of the probe block frame 20 substantially match those of the outer dimensions of the composite side-by-side independent probe blocks 50, 60 plus a small predetermined amount sufficient to allow a certain amount of "wiggle room" but insufficient to allow significant displacement of the independent probe blocks 50, 60 from their average position in the frame. This allows the probe blocks 50, 60 to independently "float" within the probe block frame 20.

It will be appreciated that other frame configurations for floating the multiple independent probe blocks 50, 60 within a single frame 20 may be used and the illustrative embodiment is provided for purposes of illustration only and not by way of limitation.

In the illustrative embodiment, the probe block frame 20 includes a front frame arm 23*a*, a rear frame arm 23*b*, a frame base 22, and a frame cover 21. The front frame arm 23*a* is substantially U-shaped, having two vertical members 25*a*, 26*a* separated by a horizontal base 24*a*. Formed integral to the horizontal base 24*a* is a frame attachment member 29 configured to mate with an arm attachment base 28 that is attachable to a robotic actuator (not shown).

The rear frame arm 23*b* is formed substantially identical to the front frame member 23*a*. The horizontal bases 24*a*, 24*b* of the front frame arm 23*a* and rear frame arm 23*b* are respectively attached on top of and along the respective front and rear edges of the frame base 22, such that the front frame arm 23*a* and rear frame arm 23*b* are aligned front-to-rear and separated by a distance determined by the width of the frame base 22. The frame cover 21 attaches to the top of the vertical members 25*a*, 26*a*, 25*b*, 26*b* of the front frame arm 23*a* and rear frame arm 23*b*.

When the probe block frame 20 is assembled, it forms an inner cavity with one or more apertures 27 through which probes 52, 53*a*, 53*b*, 62 and other protruding features of the independent probe blocks 50, 60 may extend outside the frame 20 when the independent probe blocks 50, 60 are seated side by side within the probe block frame 20. The inner cavity substantially conforms to the outer shape and dimensions of the composite probe blocks 50, 60, less any protrusions that extend through the apertures 27 of the probe block frame 20. The dimensions of the inner cavity are designed to be a predetermined small amount (e.g., several millimeters, sufficient to allow a small amount of "wiggle room") greater than the respective composite matching dimensions of the independent probe blocks 50, 60 when the probe blocks 50, 60 are mounted in position within the frame 20 (e.g., in the illustrative embodiment, side-to-side). This allows the independent probe blocks 50, 60 to "float" independently of one another within the probe block frame 20.

Figure 7:
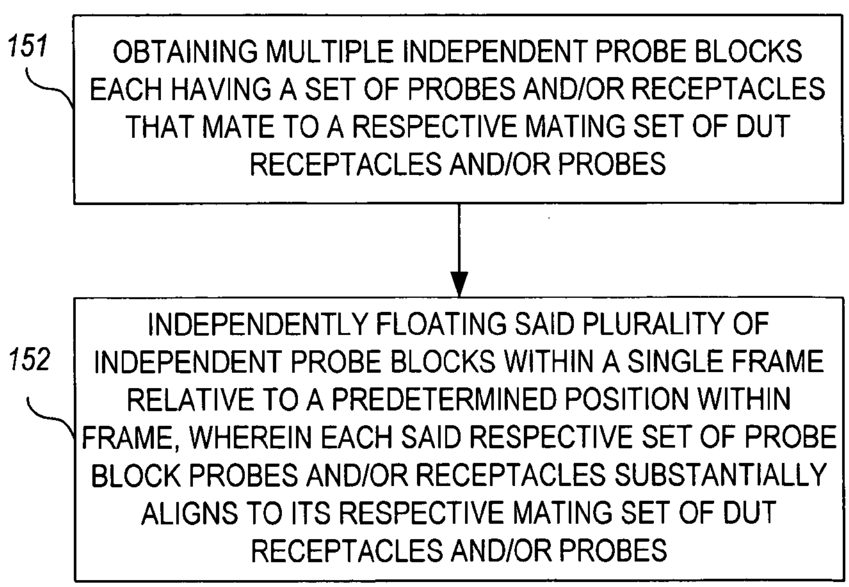
FIG. 7 is a flowchart of a floating probe block assembly method.

To assemble the probe block assembly 10, the frame cover 21 is removed from the probe block frame 20. Optionally, self-centering springs 42*a*, 42*b*, 42*c*, 42*d*, 42*e*, 42*f*, 42*g*, 42*h* are seated within the self-centering spring receptacles 54*a*, 54*b*, 54*c*, 54*d*, 54*e*, 54*f*, 54*g*, 54*h* of the independent probe blocks 50, 60, and the independent probe blocks 50, 60 are inserted into their respective designated positions within the inner cavity of the probe block frame 20 (FIG. 7, step 151, 152) through the uncovered top of the frame. In the illustrative embodiment, the system connector probe block 50 and audio jack probe block 60 are seated side-by-side with their probes 52, 53*a*, 53*b*, 62 extending in the same direction parallel to the axis of probing (see arrow A in FIG. 3). Preferably, the probe block frame 20 includes countersinked spring receptacles 70*a*, 70*b*, 70*c*, 70*d*, 70*e*, 70*f*, 70*g*, 70*h* that match up with the locations of the self-centering springs 42*a*, 42*b*, 42*c*, 42*d*, 42*e*, 42*f*, 42*g*, 42*h* of the independent probe blocks 50, 60 when the independent probe blocks are seated in position within the frame 20. Accordingly, in the illustrative embodiment, when inserting the independent probe blocks into the open frame, the protruding portions of the springs 42*b*, 42*d*, 42*f*, 42*h* on the bottoms of the independent probe blocks are carefully inserted into their respective countersinked spring receptacles 70*b*, 70*d*, 70*f*, 70*h* of the frame base 22. The cover 21 is then aligned over the top of the frame 20, carefully aligning the respective countersinked spring receptacles 70*a*, 70*c*, 70*e*, 70*g*, of the frame cover 21 over the protruding portions of the springs 42*a*, 42*c*, 42*e*, 42*g* on the tops of the independent probe blocks 50, 60, and the cover 21 is attached (for example, via screws).

During use, the arm attachment base 28 of the probe block frame 20 is fixedly attached to a linear actuator (pneumatic or otherwise, such as an actuating robotic arm, not shown) that moves in the probing direction (also referred to as "axis of probing") as indicated by arrow A. The actuator operates to move the frame 20 with independently floating probe blocks 50, 60 therein to engage the probe(s) 52, 53*a*, 53*b*, 62 of the respective probe blocks 50, 60 with their respective mating receptacles on the DUT (not shown). When engaged, the alignment features in each independent probe block 50, 60 independently aligns to the mating features in the DUT and inserts to make electrical contact.

Figure 2:
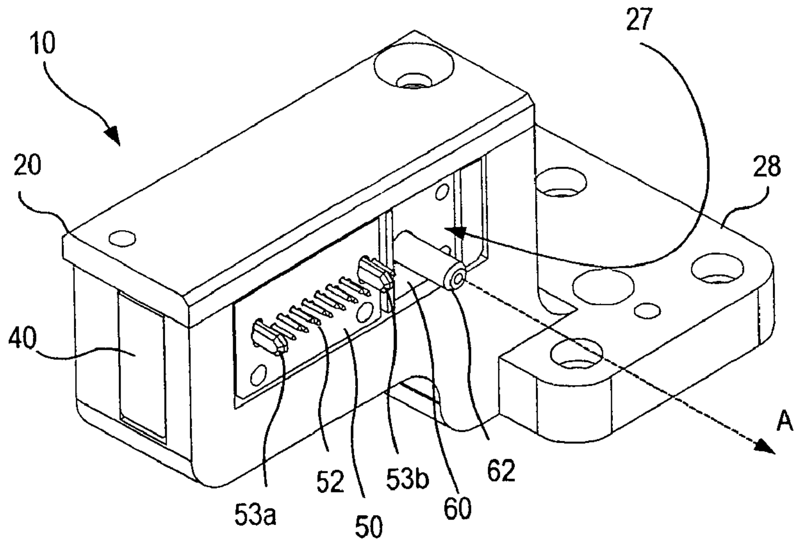
FIG. 2 is an isometric view of an assembled floating probe block assembly of FIG. 1.
Figure 5:
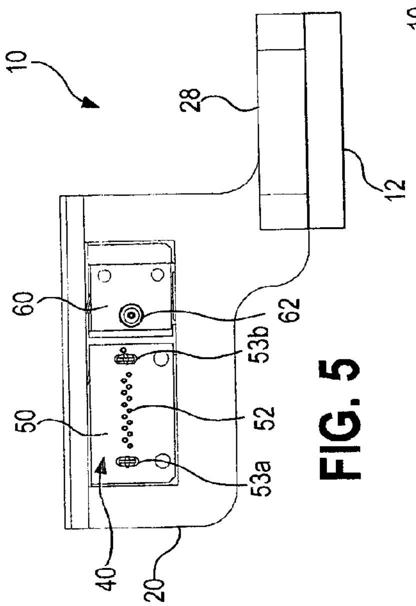
FIG. 5 is a front view of the assembled floating probe block of FIG. 1.
Figure 4:
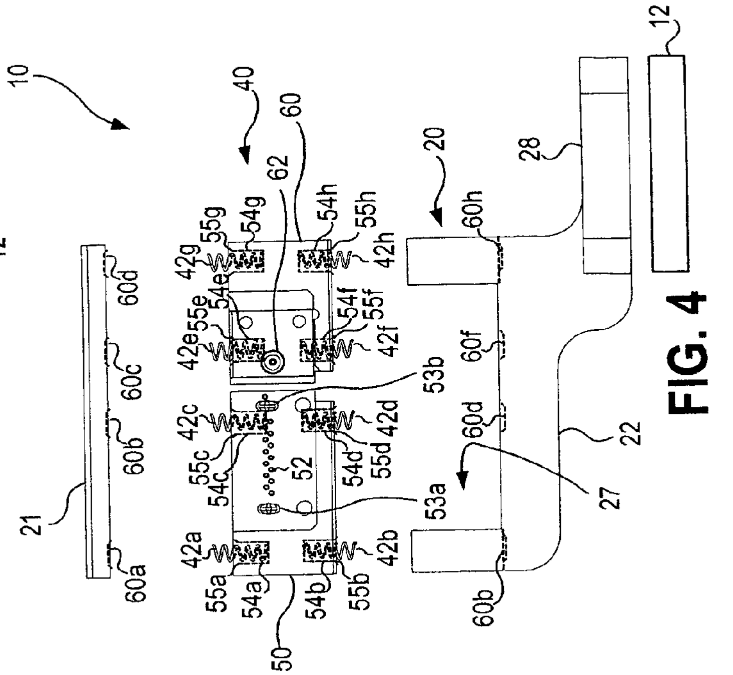
FIG. 4 is an exploded front view of the assembly of FIG. 1.

As described previously, in the preferred embodiment, each independent probe block 50, 60 utilizes self-centering springs 42*a*, 42*b*, 42*c*, 42*d*, 42*e*, 42*f*, 42*g*, 42*h* to allow the probe block to independently self-center. To this end, when the independent probe blocks 50, 60 are seated in the assembled probe block frame 20 with the cover 21 attached, as shown in FIGS. 2 and 5, the self-centering springs 42*a*, 42*b*, 42*c*, 42*d*, 42*e*, 42*f*, 42*g*, 42*h* operate to independently self-center their respective independent probe blocks 50, 60 in both the vertical and horizontal directions. The springs are mounted in the spring receptacles 54*a*, 54*b*, 54*c*, 54*d*, 54*e*, 54*f*, 54*g*, 54*h* positioned in pairs on opposite sides of the independent probe blocks 50, 60 such that the spring pairs are directly coaxial with one another. The spring receptacles 54*a*, 54*b*, 54*c*, 54*d*, 54*e*, 54*f*, 54*g*, 54*h* are preferably identical, and the springs 42*a*, 42*b*, 42*c*, 42*d*, 42*e*, 42*f*, 42*g*, 42*h* are preferably identical in size, shape, composition, and spring characteristics (e.g., spring constant). Accordingly, each independent probe block 50, 60 achieves a point of static equilibrium (or self-centering relative to the vertical plane) when the springs 42*a*, 42*b*, 42*c*, 42*d*, 42*e*, 42*f*, 42*g*, 42*h* are each compressed by the same amount.

To achieve self-centering relative to the horizontal plane, the countersinking of the hole openings 55*a*, 55*b*, 55*c*, 55*d*, 55*e*, 55*f*, 55*g*, 55*h* in each independent probe block 50, 60 allows the springs 42*a*, 42*b*, 42*c*, 42*d*, 42*e*, 42*f*, 42*g*, 42*h* to deflect side to side in the shear direction. Thus, the static equilibrium point is achieved when all springs in the independent probe blocks 50, 60 are vertically linear and horizontally undeformed. This centers each independent probe block 50, 60 in the horizontal direction.

Figure 6:
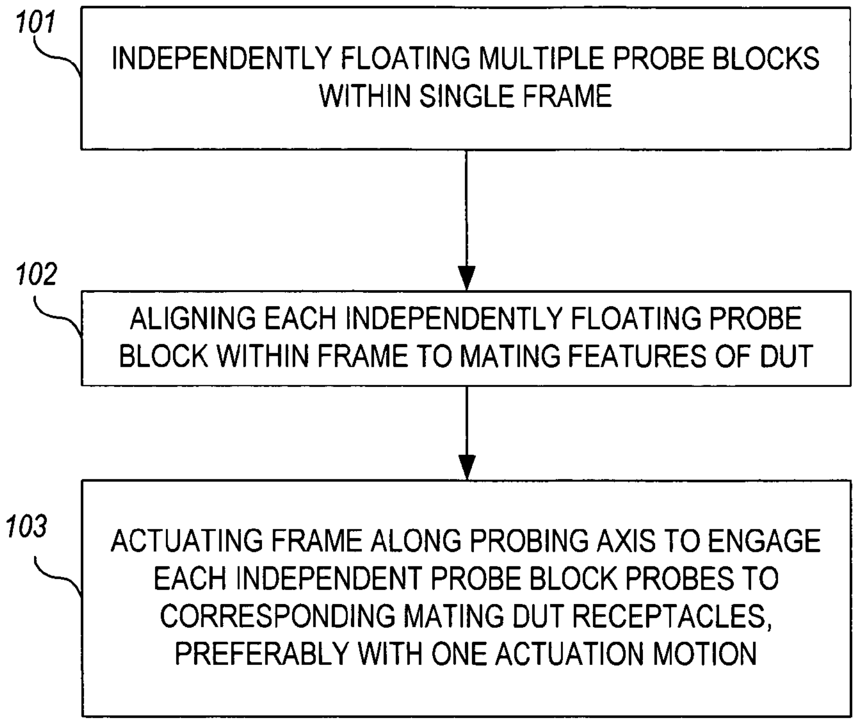
FIG. 6 is a flowchart of an insertion probing method.

During insertion probing (FIG. 6), the entire probe block assembly 10 is positioned in front of the fixtured DUT in such a position that each independent probe block 50, 60 is aligned (step 101, 102) to the respective feature to be probed on the DUT (e.g., audio jack, system connector, charge jack, etc.). In a single actuation motion (step 103), the probes 52, 53*a/b*, 62 are inserted and engaged with corresponding DUT receptacles. When the probe block 40 is disengaged, it allows easy loading and unloading of the DUT into the fixture. When it is engaged, it has full probing/insertion into the DUT.

The present invention offers several advantages over the prior art. First, as discussed in detail above, the probe block assembly 10 of the invention provides an independent float for each connector probe that is inserted into the DUT. This independent float solves the problem of DUT-to-DUT variances in DUT receptacle location. Tight tolerances are required to probe small test points on the DUT, but poor tolerances in the location of these test points relative to the outside case of the DUT and to each other make robust probing difficult. Independently floating the multiple connector probes allows the multiple probes to independently self align to the position of the mating receptacles on the DUT without regard to the position of the other receptacles on the DUT. Accordingly, DUT-to-DUT variances in the locations of the connectors to be probed are no longer a concern.

Secondly, the illustrative side-by-side arrangement of the independent probe blocks within a single assembly allows insertion probing of all DUT connectors that lie on the same side of the DUT to be probed via a single actuation motion of the probe assembly actuator. This reduces test setup time, testing time, and tester complexity.

Additionally, providing independent float of each of the connector plugs reduces the amount of insertion force required to probe the DUT, and therefore increases reliability while reducing wear.

Finally, the independent float of independent probe blocks may be combined with independent self-centering of the independent probe blocks to assist in quickly and inexpensively aligning each independent probe block with its mating feature on the DUT.

Although this preferred embodiment of the present invention has been disclosed for illustrative purposes, those skilled in the art will appreciate that various modifications, additions and substitutions are possible, without departing from the scope and spirit of the invention as disclosed in the accompanying claims.

For example, it should be understood that the although the illustrative embodiment describes a probe block assembly 10 with only two independent probe blocks, the invention extends to any probe block assembly with multiple (i.e., two or more) independent probe blocks. In addition, the positioning of the independent probe blocks within the frame may be mounted in various alternative configurations to the side-by-side configuration of the illustrative embodiment (e.g., top-to-bottom). Additionally, although the invention has been described in the application of insertion assembly, the probe blocks in the probe block assembly may alternatively include receptacles that are probed by the DUT when the probe block assembly is engaged with the DUT. It is to be understood throughout the disclosure that anywhere reference to the probe block assembly includes a "probe" relative to a mating "receptacle" on a DUT, the position of the "probe" and "receptacle" may alternatively be interchanged such that the probe block assembly provides a mating "receptacle" for a mating "probe" on the DUT. Accordingly, the invention extends to such probe/receptacle interchanges. It is also possible that other benefits or uses of the currently disclosed invention will become apparent over time.

The invention claimed is:

1. A method for probing a plurality of sets of receptacles and/or probes of a device under test (DUT), said plurality of receptacles and/or probes requiring probing parallel to a probing axis, said method comprising:

independently floating a probe block for each of said plurality of sets of DUT receptacles and/or probes of said DUT within a single probe block frame, each said independently floating probe block having a respective set of probe block probes and/or receptacles that mate to a corresponding set of said plurality of sets of receptacles and/or probes of said DUT;

substantially aligning each said independently floating probe block within said single probe block frame to its corresponding set of said plurality of sets of receptacles and/or probes of said DUT; and actuating said single probe block frame along said probing axis in a first direction to respectively engage each said respective set of probe block probes and/or receptacles to its corresponding set of DUT receptacles and/or probes.

2. A method in accordance with claim 1, wherein:

said step for actuating said single probe block frame along said probing axis in a first direction to respectively engage each said respective set of probe block probes and/or receptacles to its corresponding set of DUT receptacles and/or probes is performed with a single actuation motion.

3. A method in accordance with claim 1, further comprising:

actuating said single probe block frame along said probing axis in a second direction opposite said first direction to respectively disengage each said respective set of probe block probes and/or receptacles from its corresponding set of DUT receptacles and/or probes.

4. A method in accordance with claim 3, wherein:

said step for actuating said single probe block frame along said probing axis in a second direction opposite said first direction to respectively disengage each said respective set of probe block probes and/or receptacles from its corresponding set of DUT receptacles and/or probes.

* * * * *